United States Patent [19]
Skarvinko

[11] 3,802,889
[45] Apr. 9, 1974

[54] PHOTORESIST COMPOSITION USEFUL FOR MAKING CHROMIUM FILM MASKS

[75] Inventor: Eugene R. Skarvinko, Binghamton, N.Y.

[73] Assignee: International Business Machines Corporation, Armonk, N.Y.

[22] Filed: Aug. 3, 1972

[21] Appl. No.: 277,847

[52] U.S. Cl. .................................. 96/115 P, 96/38.3
[51] Int. Cl. ..... G03c 1/68, G03c 5/00, G03c 11/00
[58] Field of Search .................................... 96/115 P

[56] References Cited

UNITED STATES PATENTS

| | | | |
|---|---|---|---|
| 3,101,270 | 8/1963 | Evans et al. | 96/115 P |
| 3,201,255 | 8/1965 | Mueller et al. | 96/115 P |

*Primary Examiner*—David Klein
*Attorney, Agent, or Firm*—Gerald R. Gugger

[57] ABSTRACT

A photopolymerizable composition which acts as a negative etch resist useful in making chrome masks. A water based resist is employed which essentially comprises the polymerizable compound of acrylamide and gelatin to which is added the wetting agent Tergitol NPX. In the preferred method of making the chrome mask, the resist is prepared and processed with aqueous solutions thus eliminating the need for organic solvents.

2 Claims, No Drawings

PHOTORESIST COMPOSITION USEFUL FOR MAKING CHROMIUM FILM MASKS

BACKGROUND OF THE INVENTION

The production of chromium film masks per se is well known in the art. Essentially, a thin layer of chromium, along the line of 0.1 micron thick, though any standard state of the art thickness can be used, is deposited onto a transparent substrate, most preferably glass, by any known process, for instance, vacuum deposition. The formed chromium layer is then selectively etched into the desired pattern by the well known photoetching process.

Photoetching basically comprises applying a photoresist material, typically a natural or synthetic polymer, to the layer to be etched, selectively exposing the photoresist whereby certain portions thereof become soluble or insoluble upon development, removing the soluble portions which yield a negative or positive of the desired pattern, and etching the thus exposed portions of the underlying layer.

In the fabrication of chromium film masks, any type of positive photoresist or negative photoresist can be employed which is resistant to the particular etching solution used. The present invention is directed toward a method for obtaining negative photographic resist images on the chrome substrate and a negative photoresist is used wherein the exposed areas are polymerized.

In the past, negative photoresists, such as Kodak K.T.F.R., K.P.R.-3 and K.M.E.R. were used, however, the use of these presented problems because they are organic solvent type resist materials and in processing them organic solvents, such as methyl cellosolve acetate, chlorobenzene and xylene had to be used. These organic solvents are flammable and toxic and, as a result, explosion proof processing equipment and exhaust hoods had to be used. Also, special storing and handling of the waste solvents were required in order to prevent air and water pollution. It became evident that it would be much more desirable if a non-solvent system could be found wherein processing would be safer, more convenient and simple, and less costly.

SUMMARY OF THE INVENTION

In the negative image system of the present invention, a negative etch resist composition has been discovered which is prepared and processed with aqueous solutions thus eliminating the need for organic solvents. The composition comprises a deionized water base to which is added the polymerizable compound of gelatin and the monomer acrylamide. Further ingredients included in the composition are a wetting agent, Tergitol NPX; a cross-linking agent, N, N' - methylenebisacrylamide; the photosensitive element of ferric ammonium citrate; and the solvent methanol which functions to lower the surface tension of the solution.

The composition is coated on the chrome mask plate, dried and then exposed through the desired pattern. Upon exposure, the ferric salt is reduced to ferrous salt and by treatment in hydrogen peroxide, the exposed areas are polymerized resulting in a negative image. After exposure, the plate is developed by immersing in warm water followed by warm water rinsing. The plate is then heated to complete the cross-linking of polymers and upon cooling the unwanted chrome is etched in a spray etcher. Following etching the resist is removed by a hot alkaline solution.

In another embodiment of the invention, a small amount of the wetting agent sodium lauryl sulfate was added to the composition and the plate is developed in diluted acetic acid.

The main ingredients of the composition are acrylamide and gelatin which may be substituted by similar polymerizable compounds, the requirement being that they be soluble in water in a monomer state and insoluble after photopolymerization.

It is believed that the essential and critical ingredient is Tergitol NPX wetting agent which inhibits the penetration of the etchant. Tergitol is a trademark of the Union Carbide Chemicals Company and as set forth in the Union Carbide brochure F-5900G entitled "Tergitol Surfactants" copyrighted in 1956, 1957, 1959 and 1961, Tergitol NPX is a nonyl phenyl polyethylene glycol ether containing 10.5 moles of ethylene oxide. Also, heating after developing is important to impart the etch resistance by cross-linking. There is no known water based photo etch resist in the prior art that has been made to withstand etching solutions used in the manufacturing of electronic circuitry. And no other commercially available resist was able to provide as good protection during etching as the present compositions and method of treatment.

The advantages of using the present water system over a solvent system are significant. For example, there is no need to use the equipment, previously mentioned, which is required for protection when working with flammable or toxic solvents. And it is believed that the waste from processing and resist stripping are biodegradable and no further treatment will be necessary before emptying into a waste reservoir. The preparation, processing and resist stripping are very convenient and simple. From a technical standpoint, evidence obtained shows that the mask quality in terms of number of pinholes is superior to existing processes and the photographic speed and the resolution are as good or better than that of commercial resist. Economically, the cost of materials per plate is considerably less than that for commercial resist.

It is, then, a primary object of the present invention to provide a photopolymerizable, negative, water based photoresist which can withstand etching solutions used in the manufacture of electronic circuitry.

A further object of the present invention is to provide a photopolymerizable composition which acts as a negative etch resist useful in making chrome masks and which is prepared and processed with aqueous solutions.

A still further object of the present invention is to provide an improved method for making chromium film masks wherein a water based photo etch resist is used.

The foregoing and other objects, features and advantages of the invention will be apparent from the following more particular description of preferred embodiments of the invention.

DESCRIPTION OF PREFERRED EMBODIMENTS

More particularly, the following specific working examples demonstrate the invention in greater detail.

Example I

| | |
|---|---|
| Deionized water | 230g |
| Gel (E. Kodak P. 1099) | 32g |
| Tergitol NPX (10% solution) | 2g |
| Acrylamide | 18g |
| N, N' - methylenebisacrylamide | 0.7g |
| Ferric ammonium citrate | 13g |
| Methanol | 50g |

The above ingredients are prepared by soaking 32g of gel in 200 g of deionized water for 1 hour followed by melting in a water bath at 150°–160° F., while stirring. To the dissolved gel the remaining ingredients are added in the order given. The 50g of methanol are mixed with 30g of deionized water prior to the addition.

After cooling to about 120° F., the composition is filtered through a 1$\mu$ inch filter (Millipore Duralon) and a prefilter (Millipore AP 25) and coated at 100° F., ± 2° solution temperature. When coating small 2 inch × 2 inch chrome clad glass plates on a laboratory spin coater, about 35–40$\mu$ inch thickness is obtained at 500 r.p.m. Large 9½ inch × 14 inch plates yield a resist thickness of about 50–70$\mu$ inches at 300 r.p.m. After coating, the plates are dried at 160°–170° F., for 20 minutes.

The plates prepared in the above manner are ready for exposure either on a photo tracing machine or a precision contact printer. Using a tracing machine, a speed of 1.5 inches per second is possible and using a contact printer, sufficient exposure is obtained in 4 minutes. After exposure, the plate is immersed in a 1% solution of hydrogen peroxide for 15 seconds and developed by immersing in warm water at 160° F. for about 30 seconds followed by a warm deionized water rinse at 100° F. To complete the cross-linking of polymers, the plate is kept in a hot air oven at 500° F. for 15 minutes. Upon cooling, the unwanted chrome is etched in a spray etcher, such as Chemcut Model 101. Usually 2 to 3 minutes etch time is sufficient using an acidic type etchant. After etching, the resist is removed in a hot alkaline solution of sodium hydroxide at 160°–180° F.

EXAMPLE II

| | |
|---|---|
| Deionized water | 350g |
| Gel (El Kodak P. 1099) | 32g |
| Methanol | 10g |
| Acrylamide | 18g |
| N, N' - methylenebisacrylamide | 1g |
| Tergitol NPX (10% solution) | 5g |
| Sodium lauryl sulfate | 0.1g |
| Ferric ammonium citrate | 14g |

The above formulation is basically similar to the one in Example I and it was found that developing in diluted acetic acid produced good results when working at room temperature. The ingredients are prepared by soaking 32g of gel in 350g of deionized water for 1 hour followed by melting in a water bath at 150°–160° F., while stirring. To the dissolved gel the remaining ingredients are added in the order given.

After cooling to about 120° F., the composition is filtered through a 1$\mu$ inch filter (Millipore Duralon) and a prefilter (Millipore AP 25) after which it is applied to the plate with a thickness of 50–70$\mu$ inches. In this example, the resist is coated by whirling at 220–250 r.p.m. with a solution temperature of 100°–110° F. After coating, the plate is dried for 20–30 minutes at 160°–180° F.

Exposure in this example is carried out by an Aristo, Model I–1482 light source at a distance of 12 inches for 60–120 seconds. In development, the plate is first immersed in 1% hydrogen peroxide for 60 seconds and then developed for 15 to 30 seconds in 56% acetic acid at a temperature of 70°–75° F. After this, the plate is immersed in a new solution of 1% hydrogen peroxide for 60 seconds and then rinsed in 10–15% acetic acid at room temperature.

The polymers are then cross-linked by baking in a hot air oven at 500° F. for 15 minutes after which the unwanted chrome is spray etched with an acidic type etchant for 2 to 5 minutes at room temperature. The resist is then removed in a hot alkaline solution of sodium hydroxide at 160°–180° F.

While the invention has been particularly shown and described with reference to preferred embodiments thereof, it will be understood by those skilled in the art that various changes in form and details may be made therein without departing from the spirit and scope of the invention.

What is claimed is:

1. A photopolymerizable, negative, water based photoresist having the following formulation:

| | |
|---|---|
| Deionized water | 230g |
| Gel (E. Kodak P. 1099) | 32g |
| Tergitol NPX (10% solution) | 2g |
| Acrylamide | 18g |
| N, N' - methylenebisacrylamide | 0.7g |
| Ferric ammonium citrate | 13g |
| Methanol | 50g |

2. A photopolymerizable, negative, water based photoresist having the following formulation:

| | |
|---|---|
| Deionized water | 350g |
| Gel (E. Kodak P. 1099) | 32g |
| Methanol | 10g |
| Acrylamide | 18g |
| N, N' - methylenebisacrylamide | 1g |
| Tergitol NPX (10% solution) | 5g |
| Sodium lauryl sulfate | 0.1g |
| Ferric ammonium citrate | 14g |

* * * * *